United States Patent [19]
Kuo et al.

[11] Patent Number: 5,661,084
[45] Date of Patent: Aug. 26, 1997

[54] METHOD FOR CONTACT PROFILE IMPROVEMENT

[75] Inventors: So Wein Kuo, Hsin-Chu; Tsu Shih, Chakua, both of Taiwan

[73] Assignee: Taiwan Semiconductor Manufacturing Company, Ltd., Hsin-Chu, Taiwan

[21] Appl. No.: 725,808

[22] Filed: Oct. 4, 1996

[51] Int. Cl.$^6$ .................. H01L 21/283; H01L 21/31
[52] U.S. Cl. .................. 438/624; 438/628; 438/640; 438/644; 438/654
[58] Field of Search .................. 437/41 SM, 57, 437/190, 192, 195, 228, 978; 156/644.1, 653.1, 657.1

[56] References Cited

U.S. PATENT DOCUMENTS

| | | | |
|---|---|---|---|
| 4,484,978 | 11/1984 | Keyser | 156/643 |
| 5,180,689 | 1/1993 | Liu et al. | 437/228 |
| 5,200,808 | 4/1993 | Koyama et al. | 250/750 |
| 5,203,957 | 4/1993 | Yoo et al. | 156/643 |
| 5,364,804 | 11/1994 | Ho et al. | 437/41 |
| 5,489,553 | 2/1996 | Chen | 437/195 |
| 5,554,565 | 9/1996 | Liaw et al. | 437/192 |
| 5,591,675 | 1/1997 | Kim et al. | 437/195 |
| 5,593,921 | 1/1997 | Chen et al. | 437/195 |

FOREIGN PATENT DOCUMENTS

| | | | |
|---|---|---|---|
| 63-175442 | 7/1988 | Japan | 437/978 |
| 1-272121 | 10/1989 | Japan | 437/978 |

OTHER PUBLICATIONS

"Method of Anchoring Contact . . . ", IBM Tech. Disc. Bull., vol. 38, No. 6, Jun. 1995, pp. 405–407.

*Primary Examiner*—T. N. Quach
*Attorney, Agent, or Firm*—George O. Saile; Rosemary L. S. Pike

[57] ABSTRACT

A method to produce a contact or via opening and filled metallurgy for CMOS or other integrated circuits is described. Semiconductor device structures are provided in and on a semiconductor substrate. An insulating layer structure is formed thereover comprising a first layer of tetra-ethoxysilane (TEOS), a second layer of borophospho-TEOS (BPTEOS), and a third layer of TEOS. A contact opening is etched through the insulating layer structure not covered by a mask to the semiconductor device structures to be electrically contacted wherein the profile of the contact opening is not vertical because the BPTEOS layer is etched. horizontally more than the first and third TEOS layers and wherein native oxide builds up on the sidewalls of the contact opening. The substrate is dipped into a hydrofluoric acid solution to remove the native oxide on the sidewalls of the contact opening whereby the hydrofluoric acid etches the BPTEOS layer at a slower rate than it etches the first and third TEOS layers whereby the contact profile is made vertical. A glue layer is sputter deposited over the surface of the insulating layer structure and within the contact opening. A conducting layer is deposited over the glue layer filling the contact opening completing the electrical contact in the fabrication of the integrated circuit device.

21 Claims, 4 Drawing Sheets

5,661,084

1

METHOD FOR CONTACT PROFILE IMPROVEMENT

BACKGROUND OF THE INVENTION (1) Field of the Invention

The invention relates to the fabrication of integrated circuit devices, and more particularly, to a method of improving the contact profile after contact etch in the fabrication of integrated circuit devices.

(2) Description of the Prior Art

In the fabrication of integrated circuit devices, a multi-dielectric layer-structure is often used as the interlevel dielectric layer. For example, U.S. Pat. No. 5,364,804 to Ho et al teaches a multi-dielectric layer including a tetraethoxysilane (TEOS) layer. FIG. 1 illustrates a partially completed integrated circuit device. Semiconductor device structures, including, for example, gate electrodes 12 and source and drain regions 14 have been formed in and on the semiconductor substrate 10. A typical interlevel dielectric layer formed over the semiconductor device structures includes a first layer of TEOS 18 deposited by plasma enhanced chemical vapor deposition (PECVD)·to a thickness of about 1000 Angstroms, a second layer 20 of borophospho-TEOS (BPTEOS) deposited to a thickness of about 3000 Angstroms, and a third layer 22 of PECVD TEOS deposited to a thickness of about 5000 Angstroms. A contact opening is etched through the interlevel dielectric-layer to the underlying semiconductor devices, such as to source/drain region 14 as illustrated in FIG. 2. Because of the etch rate difference between PE-TEOS and BPTEOS, a reentrant contact profile exists after contact etching. That is, as shown in FIG. 2, the BPTEOS layer etches faster horizontally than do the surrounding PE-TEOS layers resulting in a reentrant shape 28 in the BPTEOS layer rather than the vertical shape of the remainder of the contact.

Typically, before the metal conductor is sputtered into the contact opening, a buffered oxide etch (BOE) of 50:1 is performed to remove the native oxide that forms on the sidewalls of the contact opening. The reentrant profile is even more pronounced after the BOE etch. It is difficult to sputter the metal glue layer, such as titanium nitride/titanium, into the reentrant contact opening. The reentrant profile also affects the stability of contact resistance.

U.S. Pat. No. 5,489,553 to Chen teaches a method of gap filling in the TEOS dielectric layer using a hydrofluoric acid (HF) etch.

SUMMARY OF THE INVENTION

Accordingly, it is a principal object of the invention to provide an effective and very manufacturable method to improve a contact profile in the fabrication of integrated circuit devices.

Another object of this invention is to provide a method for formation of a vertical contact profile through a multi-dielectric layer structure.

Yet another object of the invention is to modify the contact profile after etch to a vertical shape.

Yet another object is to reduce the deviation of contact resistance in the fabrication of integrated circuit devices.

A still further object of the invention is to provide a method of forming a contact opening wherein a metal glue layer within the contact opening can be formed easily.

In accordance with these objects of this invention, a new method to produce an improved contact or via opening and

2 filled metallurgy for CMOS or the like integrated circuits is achieved. Semiconductor device structures are provided in and on a semiconductor substrate. An insulating layer structure is formed comprising a first layer of tetraethoxysilane (TEOS), a second layer of borophospho-TEOS (BPTEOS), and a third layer of TEOS. A mask is formed over the insulating layer structure with an opening above the semiconductor device structures to be electrically contacted. A contact opening is etched through the insulating layer structure not covered by the mask to the semiconductor device structures to be electrically contacted wherein the profile of the contact opening is not vertical because the BPTEOS layer is etched horizontally more than the first and third TEOS layers and wherein native oxide builds up on the sidewalls of the contact opening. The substrate is dipped into a hydrofluoric acid solution to remove the native oxide on the sidewalls of the contact opening whereby the hydrofluoric acid etches the BPTEOS layer at a slower rate than the hydrofluoric acid etches the first and third TEOS layers whereby the contact profile is made vertical. A glue layer is sputter deposited over the surface of the insulating layer structure and within the contact opening. A conducting layer is deposited over the glue layer wherein the conducting layer fills the contact opening completing the electrical contact in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
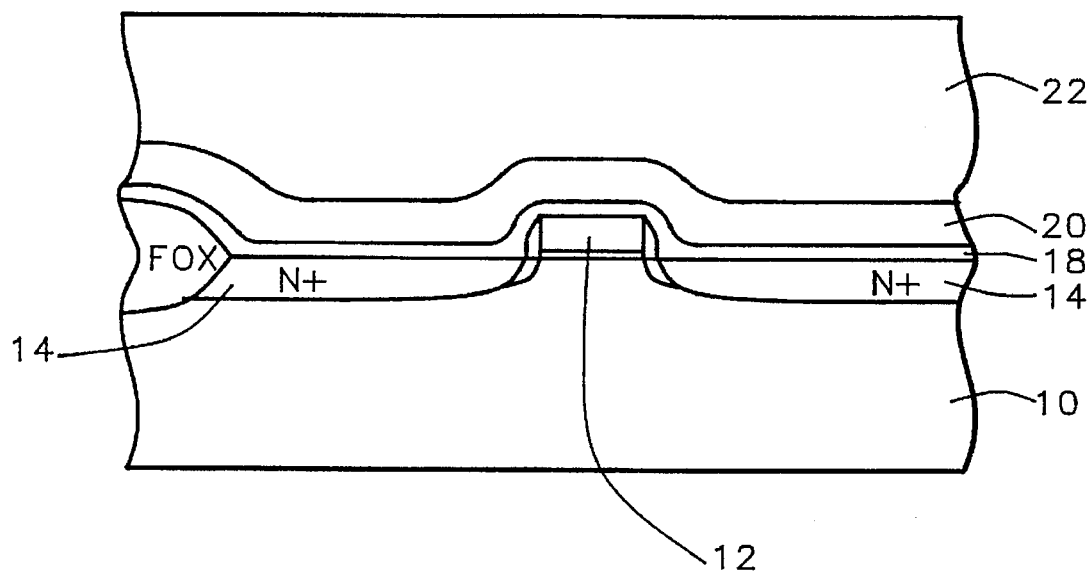
FIGS. 1 and 2 schematically illustrate in cross-sectional representation a method of forming a contact opening according to the prior art.
Figure 2:
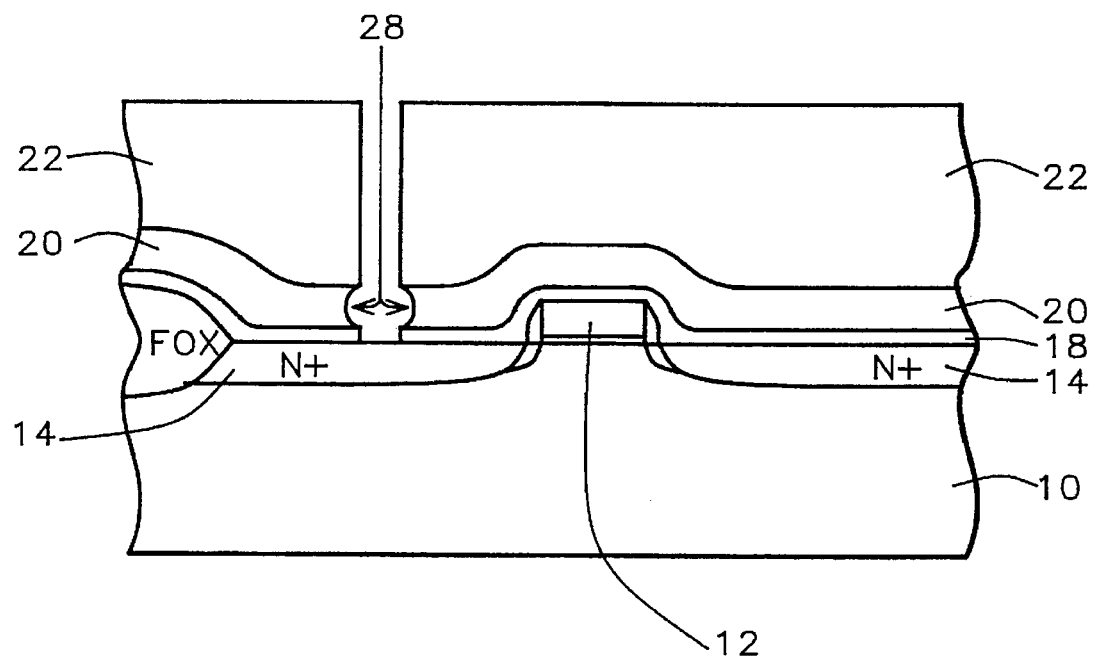

Referring now more particularly to FIGS. 3–8, there is shown a schematic cross-sectional representation of a partially completed integrated circuit device. The drawing figures. illustrate an N-channel MOSFET integrated circuit device. However, it is well understood by those skilled in the art that a P-channel FET integrated circuit device could be formed by simply substituting opposite polarities to those given for the N-channel embodiment. Also, in a similar way, a CMOSFET could be formed by making both N channel and P channel devices upon the same substrate. Furthermore, it should be understood that the invention is not limited to the MOSFET embodiment illustrated in the figures, but can be used in the manufacture of any integrated circuit device in which a contact or via opening is to be made through a multi-dielectric layer structure.

Figure 3:
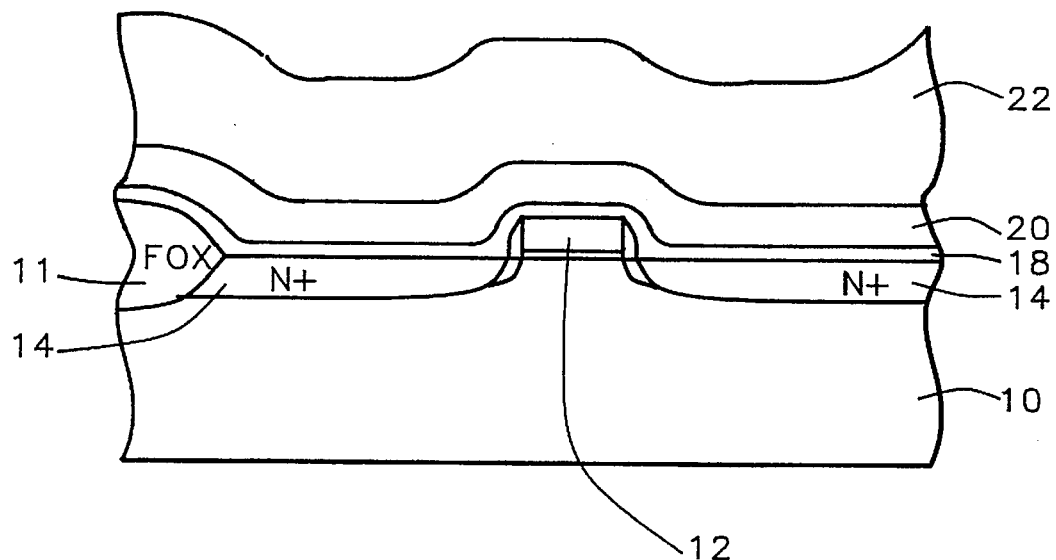
FIGS. 3 through 8 schematically illustrate in cross-sectional representation a method of forming an improved contact opening according to a preferred embodiment of the present invention.

Referring now more particularly to FIG. 3, there is illustrated a monocrystalline silicon semiconductor substrate 10. Field OXide regions 11, gate electrodes 12, and source and drain regions 14 have been formed in and on the semiconductor substrate as is conventional in the art.

Figure 4:
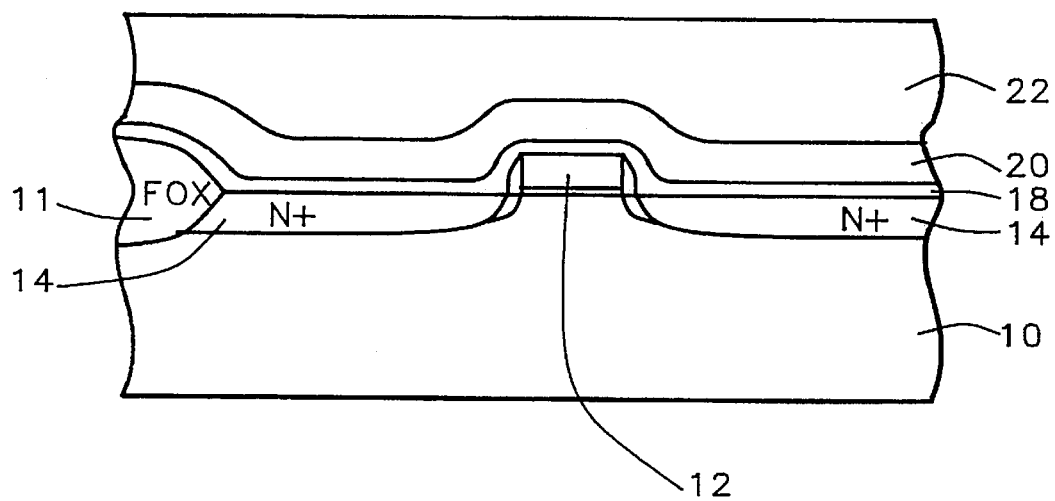

Next, the multi-dielectric insulating layer is to be formed. The first layer of the interlevel dielectric layer is a layer of TEOS 18 deposited by PECVD to a thickness of between about 1000 to 2000 Angstroms. A second layer of BPTEOS 20 is deposited overlying the first PE-TEOS layer to a thickness of between about 3000 to 4000 Angstroms. Finally, a top layer of PE-TEOS is deposited having a thickness of between about 8000 to 9000 Angstroms. It will be understood by those skilled in the art that additional layers of TEOS and BPTEOS may be deposited if desired. The interlevel dielectric layer is planarized, for example by chemical mechanical polishing (CMP). The resulting top layer 22 has a thickness of between about 5000 to 6000 Angstroms, as illustrated in FIG. 4.

Figure 5:
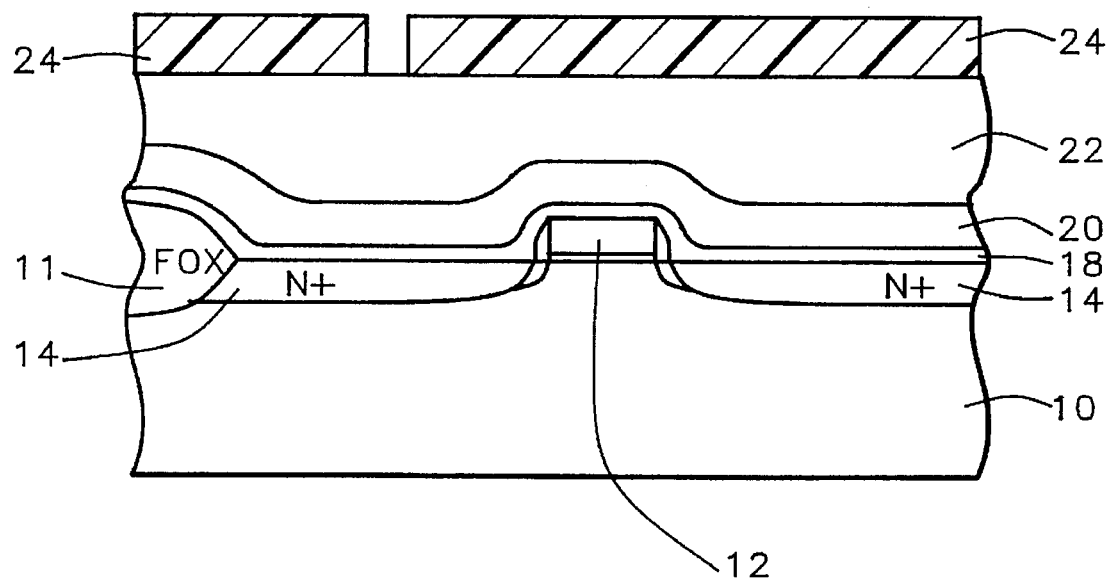
Figure 6:
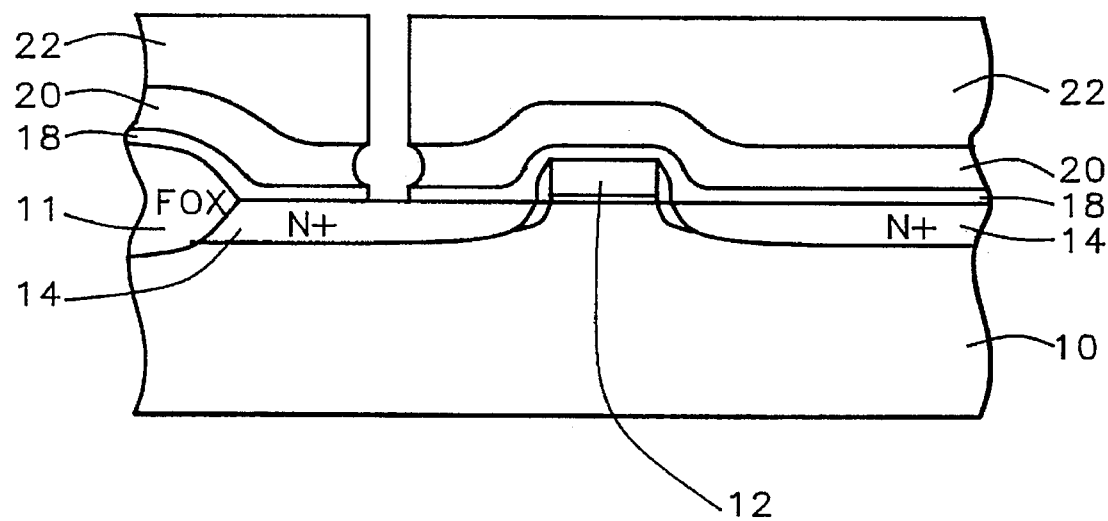

The contact or via openings are now formed through the insulating layer structure, for example, to the source/drain regions 14. Referring to FIG. 5, a photoresist mask 24 is formed by lithography and etching techniques over the insulating layer structure to provide openings over the device elements to be electrically contacted.

The contact opening is etched through the multi-layers 22, 20, and 18 using a dry etch. In general, all dry etching recipes etch BPTEOS faster than they etch PE-TEOS. As discussed above and as shown in FIG. 6, the resulting contact opening has a reentrant profile in the BPTEOS layer. That is, the BPTEOS layer is etched horizontally more than are the two PE-TEOS layers.

A native oxide, not shown, naturally forms on the walls of the contact opening after etching. This native oxide must be removed before the glue layer is sputter deposited so that the glue will adhere properly to the walls of the contact opening.

Figure 7:
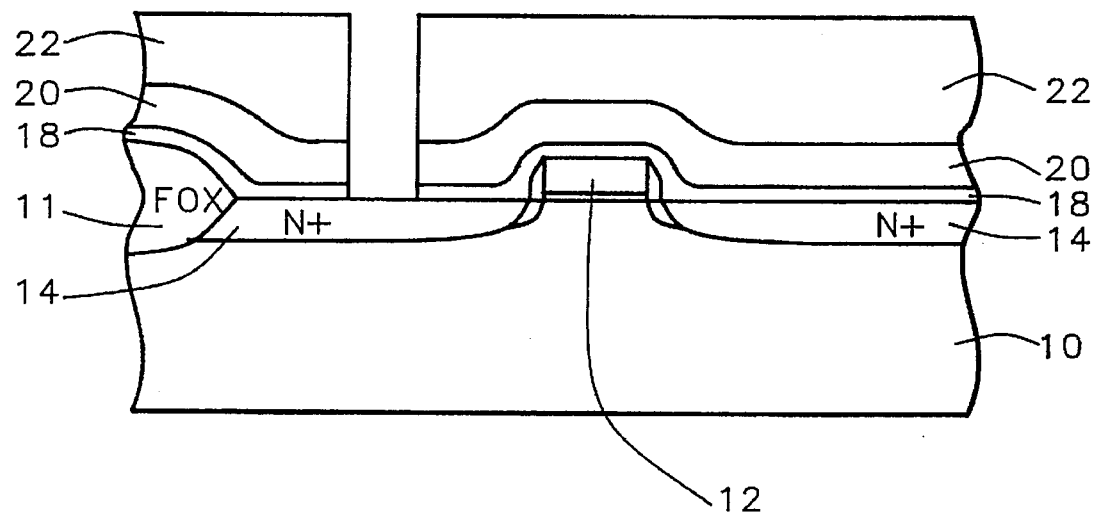

The key process of the present invention involves the modification of the contact profile from a reentrant to a vertical shape. Rather than the BOE etch which worsens the reentrant profile of the contact opening, a hydrofluoric acid (HF) solution dip is used to remove the native oxide on the walls of the contact opening. An HF concentration of between about 0.1 to 0.5% is used in the solution. The PE-TEOS surfaces etch faster than the BPTEOS surfaces, resulting in a slightly wider, but smoother opening. As seen in FIG. 7, the modified contact opening has a vertical profile after the HF dip.

Figure 8:
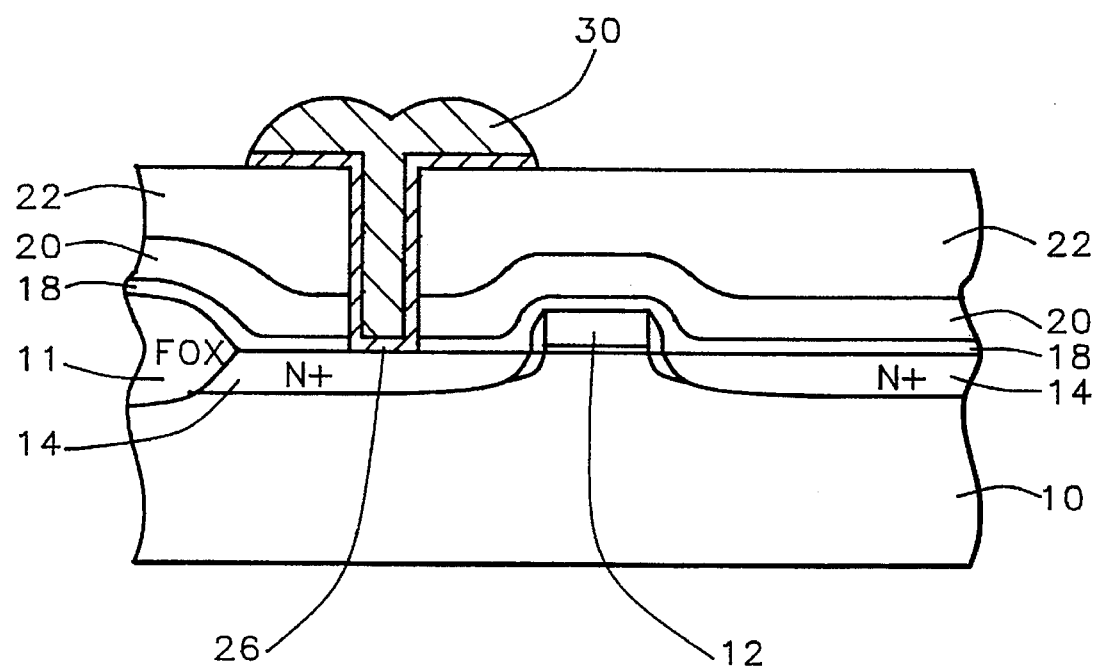

After this treatment to modify the contact profile, it is easy to sputter the metal glue layer, such as titanium nitride/titanium into the vertical contact hole. The metal glue layer 26 is sputtered into the contact opening. The glue layer may comprise a double layer of titanium nitride/titanium. This layer has a thickness of between about 1000 to 1300 Angstroms. The metal layer 30 is then deposited to fill the contact opening and patterned to form the desired metallurgy pattern, as shown in FIG. 8. The metal layer may be aluminum or tungsten or the like.

Processing can continue as is conventional in the art to form a second interlevel dielectric layer and second level metallurgy and beyond. The process of the invention may be used to modify the contact profile for any level of interlevel dielectric layer. The results of the process of the invention are a vertical contact profile, easy to form metal glue layer, and reduction of the deviation of contact resistance because of the uniformity of the glue layer.

While the invention has been particularly shown and described with reference to the preferred embodiments thereof, it will be understood by those skilled in the art that various changes in form and details may be made without departing from the spirit and scope of the invention.

What is claimed is:

1. A method for making an electrical contact in the fabrication of an integrated circuit device comprising:

providing semiconductor device structures in and on a semiconductor substrate;

forming an insulating layer structure comprising multiple layers of insulating material over said semiconductor device structures wherein there is a difference in etch rates between at least two of said multiple layers of insulating material wherein one of said insulating materials has a first etch rate and the other of said insulating materials has a second etch rate;

forming a mask over said insulating layer structure with an opening above said semiconductor device structures to be electrically contacted;

etching a contact opening through said insulating layer structure not covered by said mask to said semiconductor device structures to be electrically contacted wherein because of said difference in etch rates between said at least two of said multiple layers of insulating material, the profile of said contact opening is not vertical because at least one of said insulating material layers having said first etch rate is etched horizontally more than the other said insulating material layers having said second etch rate and wherein native oxide builds up on the sidewalls of said contact opening;

dipping said substrate into a hydrofluoric acid solution to remove said native oxide on the sidewalls of said contact opening whereby said hydrofluoric acid etches said insulating material layer having said first etch rate at a slower rate than said hydrofluoric acid etches said insulating material layers having said second etch rate whereby said contact profile is made vertical;

sputter depositing a glue layer over the surface of said insulating layer structure and within said contact opening; and depositing a conducting layer over said glue layer wherein said conducting layer fills said contact opening completing said electrical contact in the fabrication of said integrated circuit device.

2. The method according to claim 1 wherein said semiconductor device structures to be electrically contacted are source/drain regions of a CMOS integrated circuit device.

3. The method according to claim 1 wherein said semiconductor device structures are a metallurgy layer and said electrical contact is a via metallurgy between metal layers in said integrated circuit.

4. The method according to claim 1 wherein said insulating layer structure is composed of a first layer of tetraethoxysilane (TEOS) having a thickness of between about 1000 to 2000 Angstroms, a second layer of borophosphoTEOS (BPTEOS) having a thickness of between about 3000 to 4000 Angstroms, and a third layer of TEOS having a thickness between about 5000 to 6000 Angstroms.

5. The method according to claim 4 wherein said BPTEOS layer has said first etch rate and said first and third TEOS layers have said second etch rate.

6. The method according to claim 1 wherein said hydrofluoric acid solution comprises 0.1 to 0.5% HF.

7. The method according to claim 1 wherein said glue layer is deposited to a thickness of between about 1000 to 1300 Angstroms.

8. The method according to claim 1 wherein said glue layer comprises a first layer of titanium nitride and a second layer of titanium.

9. The method according to claim 1 wherein said conducting layer comprises a metal.

10. A method for making electrical contact to source/drain regions of a CMOS integrated circuit device comprising:

providing CMOS semiconductor device structures in and on a semiconductor substrate including said source/drain regions;

forming an insulating layer structure comprising multiple layers of insulating material over said CMOS semiconductor device structures wherein there is a difference in etch rates between at least two of said multiple layers of insulating material wherein one of said insulating materials has a first etch rate and the other of said insulating materials has a second etch rate;

forming a mask over said insulating layer structure with an opening above said CMOS semiconductor device structures to be electrically contacted;

etching a contact opening through said insulating layer structure not covered by said mask to said CMOS semiconductor device structures to be electrically contacted wherein because of said difference in etch rates between said at least two of said multiple layers of insulating material, the profile of said contact opening is not vertical because at least one of said insulating material layers having said first etch rate is etched horizontally more than the other said insulating material layers having said second etch rate and wherein native oxide builds up on the sidewalls of said contact opening;

dipping said substrate into a hydrofluoric acid solution to remove said native oxide on the sidewalls of said contact opening whereby said hydrofluoric acid etches said insulating material layer having said first etch rate at a slower rate than said hydrofluoric acid etches said insulating material layers having said second etch rate whereby said contact profile is made vertical;

sputter depositing a glue layer over the surface of said insulating layer structure and within said contact opening; and depositing a conducting layer over said glue layer wherein said conducting layer fills said contact opening completing said electrical contact to said source/drain regions of said CMOS integrated circuit in the fabrication of said integrated circuit device.

11. The method according to claim 10 wherein said insulating layer structure is composed of a first layer of tetraethoxysilane (TEOS) having a thickness of between about 1000 to 2000 Angstroms, a second layer of borophospho-TEOS (BPTEOS) having a thickness Of between about 3000 to 4000 Angstroms, and a third layer of TEOS having a thickness between about 5000 to 6000 Angstroms.

12. The method according to claim 11 wherein said BPTEOS layer has said first etch rate and said first and third TEOS layers have said second etch rate.

13. The method according to claim 10 wherein said hydrofluoric acid solution comprises 0.1 to 0.5% HF.

14. The method according to claim 10 wherein said glue layer comprises a first layer of titanium nitride and a second layer of titanium.

15. The method according to claim 10 wherein said conducting layer comprises a metal.

16. A method for making an electrical contact in the fabrication of an integrated circuit device comprising:

providing semiconductor device structures in and on a semiconductor substrate;

forming an insulating layer structure comprising a first layer Of tetraethoxysilane (TEOS), a second layer of borophospho-TEOS (BPTEOS), and a third layer of TEOS;

forming a mask over said insulating layer structure with an opening above said semiconductor device structures to be electrically contacted;

etching a contact opening through said insulating layer structure not covered by said mask to said semiconductor device structures to be electrically contacted wherein the profile of said contact opening is not vertical because said BPTEOS layer is etched horizontally more than said first and third TEOS layers and wherein native oxide builds up on the sidewalls of said contact opening;

dipping said substrate into a hydrofluoric acid solution to remove said native oxide on the sidewalls of said contact opening whereby said hydrofluoric acid etches said BPTEOS layer at a slower rate than said hydrofluoric acid etches said first and third TEOS layers whereby said contact profile is made vertical;

sputter depositing a glue layer over the surface of said insulating layer structure and within said contact opening; and depositing a conducting layer over said glue layer wherein said conducting layer fills said contact opening completing said electrical contact in the fabrication of said integrated circuit device.

17. The method according to claim 16 wherein said semiconductor device structures to be electrically contacted-are source/drain regions of a CMOS integrated circuit device.

18. The method according to claim 16 wherein said semiconductor device structures are a metallurgy layer and said electrical contact is a via metallurgy between metal layers in said integrated circuit.

19. The method according to claim 16 wherein said first TEOS layer has a thickness of between about 1000 to 2000 Angstroms, said second layer BPTEOS has a thickness of between about 3000 to 4000 Angstroms, and said third layer of TEOS has a thickness of between about 5000 to 6000 Angstroms.

20. The method according to claim 16 wherein said first and third TEOS layers are deposited by plasma-enhanced chemical vapor deposition.

21. The method according to claim 16 wherein said hydrofluoric acid solution comprises 0.1 to 0.5% HF.

* * * * *